(12) United States Patent
Finn

(10) Patent No.: US 7,971,339 B2
(45) Date of Patent: Jul. 5, 2011

(54) METHOD AND APPARATUS FOR MAKING A RADIO FREQUENCY INLAY

(75) Inventor: David Finn, Tourmakeady (IE)

(73) Assignee: HID Global GmbH (DE)

( * ) Notice: Subject to any disclaimer, the term of this patent is extended or adjusted under 35 U.S.C. 154(b) by 807 days.

(21) Appl. No.: 11/860,162

(22) Filed: Sep. 24, 2007
(Under 37 CFR 1.47)

(65) Prior Publication Data

US 2010/0141453 A1    Jun. 10, 2010

Related U.S. Application Data

(63) Continuation of application No. 11/733,756, filed on Apr. 10, 2007, now Pat. No. 7,546,671.

(60) Provisional application No. 60/829,862, filed on Oct. 17, 2006, provisional application No. 60/826,923, filed on Sep. 26, 2006.

(51) Int. Cl.
*H01P 11/00* (2006.01)

(52) U.S. Cl. .... 29/600; 29/592.1; 29/831; 343/700 MS; 343/786

(58) Field of Classification Search ............ 29/600, 29/592.1–595, 830–832, 840–842; 343/700 MS, 343/786–787, 572.7; 235/492, 441, 487
See application file for complete search history.

(56) References Cited

U.S. PATENT DOCUMENTS

| | | | |
|---|---|---|---|
| 3,116,889 A | 1/1964 | Lasch, Jr. et al. | |
| 3,384,283 A | 5/1968 | Mims | |
| 3,674,602 A | 7/1972 | Keogh et al. | |
| 3,674,914 A | 7/1972 | Burr | |
| 3,917,148 A | 11/1975 | Runyon | |
| 4,437,603 A | 3/1984 | Kobayashi et al. | |
| 4,450,623 A | 5/1984 | Burr | |
| 4,641,773 A | 2/1987 | Morino et al. | |
| 4,642,321 A | 2/1987 | Schoenberg et al. | |
| 4,693,778 A | 9/1987 | Swiggett et al. | |
| 4,711,026 A | 12/1987 | Swiggett et al. | |
| 4,791,285 A | 12/1988 | Ohki | |
| 4,861,533 A | 8/1989 | Bertin et al. | |
| 4,912,143 A | 3/1990 | Ahn et al. | |
| 5,008,619 A | 4/1991 | Keogh et al. | |
| 5,041,826 A | 8/1991 | Milheiser | |
| 5,094,907 A | 3/1992 | Yamamura et al. | |
| 5,186,776 A | 2/1993 | Boyce et al. | |

(Continued)

FOREIGN PATENT DOCUMENTS

AU          720773          6/2000

(Continued)

OTHER PUBLICATIONS

AIT, Coil Manufacturing Technology, Sep. 1995, 6 pages.

(Continued)

*Primary Examiner* — Minh Trinh
(74) *Attorney, Agent, or Firm* — Sheridan Ross P.C.

(57) ABSTRACT

A method and apparatus are provided for making radio frequency (RF) inlays. The RF inlays include an integrated circuit and an antenna affixed to a substrate material carrying the integrated circuit. During processing, portions of the wire forming the antenna are located adjacent to, but not directly over the integrated circuit. In the subsequent processing step, the wire ends are placed in contact with and secured to the integrated circuit terminal areas.

10 Claims, 7 Drawing Sheets

U.S. PATENT DOCUMENTS

| | | | |
|---|---|---|---|
| 5,201,453 A | 4/1993 | Amador et al. | |
| 5,281,855 A | 1/1994 | Hadden et al. | |
| 5,288,008 A | 2/1994 | Haji et al. | |
| 5,294,290 A | 3/1994 | Reeb | |
| 5,365,657 A | 11/1994 | Brown et al. | |
| 5,377,894 A | 1/1995 | Mizoguchi et al. | |
| 5,393,001 A | 2/1995 | Gustafson | |
| 5,531,390 A | 7/1996 | Gustafson | |
| 5,535,043 A | 7/1996 | La Fiandra et al. | |
| 5,606,488 A | 2/1997 | Gustafson | |
| 5,649,352 A | 7/1997 | Gustafson | |
| 5,770,807 A | 6/1998 | Finn et al. | |
| 5,773,812 A | 6/1998 | Kreft | |
| 5,809,633 A | 9/1998 | Mundigl et al. | |
| 6,008,993 A | 12/1999 | Kreft | |
| 6,023,837 A | 2/2000 | Finn | |
| 6,055,720 A | 5/2000 | Finn et al. | |
| 6,067,235 A | 5/2000 | Finn et al. | |
| 6,088,230 A | 7/2000 | Finn et al. | |
| 6,095,423 A | 8/2000 | Houdeau et al. | |
| 6,102,275 A | 8/2000 | Hill et al. | |
| 6,142,381 A | 11/2000 | Finn et al. | |
| 6,152,348 A | 11/2000 | Finn et al. | |
| 6,173,879 B1 | 1/2001 | Chiba | |
| 6,190,942 B1 | 2/2001 | Wilm et al. | |
| 6,233,818 B1 | 5/2001 | Finn et al. | |
| 6,288,443 B1 | 9/2001 | Finn et al. | |
| 6,295,720 B1 | 10/2001 | Finn et al. | |
| 6,310,778 B1 | 10/2001 | Finn et al. | |
| 6,313,566 B1 | 11/2001 | Cunningham et al. | |
| 6,351,525 B1 | 2/2002 | Rodriguez | |
| 6,471,878 B1 | 10/2002 | Greene et al. | |
| 6,491,202 B1 | 12/2002 | Kyomasu et al. | |
| 6,521,829 B2 | 2/2003 | Matsumura et al. | |
| 6,604,686 B1 | 8/2003 | Taban | |
| 6,619,530 B2 | 9/2003 | Ushiki et al. | |
| 6,626,364 B2 | 9/2003 | Taban | |
| 6,628,240 B2 | 9/2003 | Amadeo | |
| 6,662,430 B2 * | 12/2003 | Brady et al. | 29/600 |
| 6,698,089 B2 | 3/2004 | Finn et al. | |
| 6,779,348 B2 | 8/2004 | Taban | |
| 6,810,580 B2 * | 11/2004 | Yamaguchi et al. | 29/748 |
| 6,870,497 B2 | 3/2005 | Kondo et al. | |
| 6,897,090 B2 | 5/2005 | DiStefano et al. | |
| 7,059,535 B2 | 6/2006 | Rietzler | |
| 7,105,915 B1 | 9/2006 | Finn et al. | |
| 7,229,022 B2 | 6/2007 | Rietzler | |
| 7,546,671 B2 * | 6/2009 | Finn | 29/592.1 |
| 2002/0020903 A1 | 2/2002 | Kreft et al. | |
| 2002/0060239 A1 | 5/2002 | Or et al. | |
| 2006/0208066 A1 | 9/2006 | Finn et al. | |

FOREIGN PATENT DOCUMENTS

| | | |
|---|---|---|
| CA | 2348461 | 5/2000 |
| CA | 2555034 | 9/2005 |
| DE | 2111396 | 9/1971 |
| DE | 3247344 | 7/1983 |
| DE | 3622246 | 1/1987 |
| DE | 3624630 | 2/1987 |
| DE | 3805584 | 8/1989 |
| DE | 3937988 | 5/1990 |
| DE | 4205084 | 9/1993 |
| DE | 4325334 | 12/1994 |
| DE | 4329708 | 3/1995 |
| DE | 4332055 | 3/1995 |
| DE | 4408124 | 9/1995 |
| DE | 4410732 | 10/1995 |
| DE | 4417625 | 11/1995 |
| DE | 4431605 | 3/1996 |
| DE | 4446289 | 6/1996 |
| DE | 19509999 | 9/1996 |
| DE | 19525933 | 1/1997 |
| DE | 19534480 | 3/1997 |
| DE | 19604840 | 3/1997 |
| DE | 19541039 | 5/1997 |
| DE | 19541996 | 5/1997 |
| DE | 19619771 | 8/1997 |
| DE | 19610507 | 9/1997 |
| DE | 19616424 | 10/1997 |
| DE | 19654902 | 10/1997 |
| DE | 19620242 | 11/1997 |
| DE | 19713634 | 11/1997 |
| DE | 19634473 | 1/1998 |
| DE | 19634661 | 3/1998 |
| DE | 19646717 | 5/1998 |
| DE | 19651566 | 6/1998 |
| DE | 59503553 | 10/1998 |
| DE | 19716912 | 11/1998 |
| DE | 19741984 | 6/1999 |
| DE | 19751043 | 6/1999 |
| DE | 59602458 | 8/1999 |
| DE | 59602495 | 8/1999 |
| DE | 19822383 | 12/1999 |
| DE | 59507294 | 12/1999 |
| DE | 19850353 | 3/2000 |
| DE | 59701709 | 6/2000 |
| DE | 19903784 | 8/2000 |
| DE | 19920593 | 11/2000 |
| DE | 59508993 | 3/2001 |
| DE | 19946254 | 4/2001 |
| DE | 19934789 | 5/2001 |
| DE | 10009456 | 9/2001 |
| DE | 59607684 | 10/2001 |
| DE | 59707230 | 6/2002 |
| DE | 59610675 | 9/2003 |
| DE | 59711861 | 9/2004 |
| DE | 102004010013 | 9/2004 |
| DE | 102004011929 | 9/2005 |
| DE | 202005016382 | 2/2006 |
| DE | 102004043747 | 3/2006 |
| DE | 102004045896 | 3/2006 |
| EP | 0133820 | 3/1985 |
| EP | 0212238 | 3/1987 |
| EP | 0217019 | 4/1987 |
| EP | 0227002 | 7/1987 |
| EP | 0276928 | 8/1988 |
| EP | 0481776 | 4/1992 |
| EP | 0593966 | 4/1994 |
| EP | 0692770 | 1/1996 |
| EP | 0753180 | 1/1997 |
| EP | 0759830 | 3/1997 |
| EP | 0804799 | 11/1997 |
| EP | 0815475 | 1/1998 |
| EP | 0839360 | 5/1998 |
| EP | 0852040 | 7/1998 |
| EP | 0859681 | 8/1998 |
| EP | 0880754 | 12/1998 |
| EP | 0922289 | 6/1999 |
| EP | 0944922 | 9/1999 |
| EP | 0976099 | 2/2000 |
| EP | 1125248 | 8/2001 |
| EP | 1177579 | 2/2002 |
| GB | 1352557 | 5/1974 |
| GB | 1593235 | 7/1981 |
| GB | 2180175 | 3/1987 |
| GB | 2180408 | 3/1987 |
| JP | 062008313 | 1/1987 |
| JP | 1264234 | 10/1989 |
| JP | 06351194 | 12/1994 |
| JP | 9507727 | 8/1997 |
| JP | 9510834 | 10/1997 |
| JP | 11502334 | 2/1999 |
| JP | 11514933 | 12/1999 |
| JP | 11515120 | 12/1999 |
| WO | WO 91/16718 | 10/1991 |
| WO | WO 93/20537 | 10/1993 |
| WO | WO 94/28562 | 12/1994 |
| WO | WO 95/03685 | 2/1995 |
| WO | WO 95/26538 | 10/1995 |
| WO | WO 95/32073 | 11/1995 |
| WO | WO 96/07984 | 3/1996 |
| WO | WO 96/13793 | 5/1996 |
| WO | WO 96/22608 | 7/1996 |
| WO | WO 96/29618 | 9/1996 |
| WO | WO 97/04415 | 2/1997 |
| WO | WO 97/11437 | 3/1997 |

| WO | WO 97/17191 | 5/1997 |
| WO | WO 97/30418 | 8/1997 |
| WO | WO 97/35273 | 9/1997 |
| WO | WO 98/02848 | 1/1998 |
| WO | WO 98/09305 | 3/1998 |
| WO | WO 98/26453 | 6/1998 |
| WO | WO 00/26855 | 5/2000 |
| WO | WO 00/68994 | 11/2000 |
| WO | WO 01/08089 | 2/2001 |
| WO | WO 02/46896 | 6/2002 |
| WO | WO 02/077918 | 10/2002 |
| WO | WO 2004/006178 | 1/2004 |

OTHER PUBLICATIONS

AIT, CoilPro Wiring Systems, CoilPro 2000, date unknown, 1 page.
AIT, Embedded Wire Technology, date unknown, 1 page.
AIT, RFID Embedded Wire Technology, date unknown, 1 page.
European Search Report and Written Opinion, Reference No. E87054 EP (GS/, Application No. 07018301.7, Aug. 2, 2008; 6 pgs.
International Search Report for International (PCT) Application No. PCT/IB2007/004658, mailed Mar. 4, 2009.
Written Opinion for International (PCT) Application No. PCT/IB2007/004658, mailed Mar. 4, 2009.
International Preliminary Report on Patentability for International (PCT) Application No. PCT/IB2007/004658, mailed Apr. 9, 2009.
Official Action for European Patent Application No. 07875200.3, mailed Nov. 2, 2009.
Official Action for European Patent Application No. 07875200.3, dated Oct. 29, 2010.

* cited by examiner

METHOD AND APPARATUS FOR MAKING A RADIO FREQUENCY INLAY

CROSS-REFERENCE TO RELATED APPLICATIONS

The present application claims the benefit under 35 U.S.C. §119(e) of U.S. Provisional Application Ser. Nos. 60/826,923 filed Sep. 26, 2006 and 60/829,862 filed Oct. 17, 2006; and claims the benefit under 35 U.S.C. §120 of U.S. application Ser. No. 11/733,756 filed Apr. 10, 2007.

FIELD OF THE INVENTION

The present invention relates to a method and apparatus for making radio frequency (RF) inlays and the resulting inlay, and more particularly to a method and apparatus for making high frequency RF devices that include an integrated circuit and an antenna affixed to a substrate material.

BACKGROUND OF THE INVENTION

An RF inlay is generally understood to be an integrated circuit and antenna joined together on some type of substrate. Typically, the inlay is subjected to further processing to make a final product. Further processing may include adding additional outer layers of material such as plastic to make a card-shaped device. Other finishing techniques may form the inlay into a variety of final forms depending upon the final application of the product.

In general terms, the integrated circuit is inductively coupled to one or more interrogating devices or readers through the antenna by means of radio frequency communication. The integrated circuit or chip contains information that is useful for performing various tasks. One type of information is identification information pertaining to the holder or user of the RF device. In this case, the RF device may also be referred to as a radio frequency identification (RFID) device. Not all RF devices necessarily contain information about the identity of the user and some RF devices contain information in addition to the identity of the user.

RF inlays in their finished form are used in a variety of applications. For example, RF inlays are used for making security access devices (RFID devices) or may be used for other applications that may or may not involve identification of the user, including but not limited to access to computer or computer networks and databases, public transportation passes, toll way access passes, vending machine payment devices, debit and/or credit cards and passports. Given the variety and expanding end user applications for RF devices, they are also sometimes referred to as "smart cards." Some identification applications, such as passports, now utilize RFID inlays or RFID prelams (transponders that have been subjected to a lamination process) to store identification data and to allow efficient and rapid transfer of the identification data for processing by appropriate governmental agencies. The identification data may include biometric data, such as fingerprints, and/or photos of the passport holder, as well as information identifying the holder.

A variety of methods exist for manufacturing RF inlays. In some methods a substrate of one or more layers is processed in various steps including hot and/or cold lamination. A chip and antenna subassembly is incorporated in one or more of the layers and the layers are joined together by adhesives or by softening the plastic layer and, by means of pressure, joining the layers together. In other methods, wire is affixed to or embedded within a substrate in the form of an antenna and the opposing ends of the antenna coil are attached to the terminals of an integrated circuit (IC or chip) or to the terminal areas of a chip module. A chip module as that term is used herein comprises an integrated circuit attached to a lead frame having enlarged terminal areas. The terminal areas of the chip are connected to the enlarged terminal areas of the lead frame by either extremely small and delicate wires, on the order of 20 to 28 microns in diameter, or through a conductive adhesive such as in the case of a flip chip. The chip and the electrical connections to the terminal areas of the lead frame are encased in an epoxy layer for protection. The combination or subassembly of the chip/chip module and the coil of wire that forms an antenna is sometimes referred to as a transponder. The wire forming the antenna may be embedded fully or partially within the substrate by use of an ultrasonic wire embedding technique, as understood by those skilled in the art. The chip/chip module may be secured to the substrate by either placing it on the surface of the substrate or by placing it in a recess formed in the substrate. Adhesive may or may not be used to adhere the chip/chip module to the substrate. The ends of the coil of wire may be bonded or connected to the terminal areas of the chip or chip module at about the same time as the wire is embedded in the substrate, or the bonding may be done in a separate or subsequent manufacturing step.

Nominally, the wire used in the manufacture of RF inlays, where the wire is ultrasonically embedded in a substrate, is 110 to 120 microns in diameter, which includes an outer insulating layer. The wire is insulated to prevent short-circuiting of the antenna, as the windings of wire forming the antenna are closely positioned and may touch. The insulation layer is typically made from polyurethanes, polyvinylbutyrals, polyamides, polyesterimids and similar compounds. Thicker or larger diameter wires, compared to thinner or smaller diameter wires, are more easily handled and typically provide a farther read range when inductively coupled to a reader. Larger diameter wires are also more robust and are susceptible to removal from an RF device without damage to the operation and functionality of the transponder. Potential removal and reuse of a transponder raises a number of security and privacy problems. For example, if a legitimate transponder subassembly (chip/chip module and antenna) may be removed from one passport and placed in another fraudulent passport, substantial security issues are raised.

There are a number of patents that disclose various devices and methods for the manufacture of RF devices including the manufacture of inlays. For example, U.S. Pat. Nos. 6,698,089 and 6,233,818 disclose methods of making an RF device wherein at least one chip and one antenna are affixed to a chip mounting board or substrate. The wire forming the antenna is embedded in the substrate by use of an ultrasonic generator. As part of the wire embedding process disclosed in each of these patents, the insulated antenna wire is first fixed to the substrate. The insulated wire is then guided directly over and away from a terminal area of the RFID chip and embedded to the substrate on the opposite side of the chip from the first embedding location to linearly align the wire between the two fixed locations and directly across the terminal area. Next, the antenna is formed by embedding the insulated wire into the substrate at a location spaced from the chip and terminal areas, the antenna being formed with a specific number of turns or loops of the wire. The antenna wire is then guided over another terminal area of the RFID chip and finally embedded on the opposite side to anchor the second end of the wire directly across the other terminal area of the chip. The wire is cut and the embedding head (or embedding tool) moves to a second transponder site on the substrate to repeat the same process. In the next stage of production, the wire portions passing directly over the terminal areas of the RFID chip are interconnected to the terminal areas by means of thermal compression bonding. Alternatively, the wire may be embedded as described and the chip subsequently positioned in a pre-designated recess where the terminals of the chip will contact the previously secured wire. The ends of the wire then will be bonded to the terminal areas of the chip by means of thermal compression bonding. U.S. Pat. No. 6,088,230 describes an alternative process where a first end of the wire is positioned in contact with a first terminal area of a chip or chip module and is bonded to the first terminal area, then the embedding tool embeds the wire in the substrate to form an antenna, and then the wire is positioned over a second terminal area of the chip or chip module where it is bonded to the terminal area.

While the inventions disclosed in these references may be adequate for the intended purposes, there is still a need for an improved method of making RF inlays for various applications including but not limited to contactless smart cards and other security access devices.

SUMMARY OF THE INVENTION

In accordance with the present invention, a method and apparatus are provided for manufacturing RF inlays or similar devices. In one aspect of the present invention, it may be considered a method of making inlays. In another aspect of the present invention, it may be considered the apparatus or manufacturing equipment used for making the inlays. In yet another aspect of the present invention, it may be considered an apparatus for making the RF inlays, including various sub-combinations, that is, the various apparatus components to produce the RF inlay. In a further aspect, the present invention may be considered the resulting inlay device produced by the method or apparatus.

In accordance with the apparatus for making the inlays, one or more wire embedding heads, or sonotrodes as they may also be called, are used to embed antenna wire partially or fully into a substrate. The embedding heads may form the wire into virtually any pattern including forming the windings of an antenna. The substrate may accommodate one or a plurality of antennas. A single antenna may correspond to a single inlay or two or more antennas may be positioned in close proximity to each other and correspond to a single inlay. In the latter case, the plurality of antennas may be connected to a common chip/chip module or to different chips/chip modules and function independently. If a plurality of embedding heads is utilized, the embedding heads may move in unison or independently. Upon completion of the wire embedding at each transponder site, the wire is cut and either the embedding head(s) move to the next site or the substrate moves relative to the embedding head(s) to position new transponder sites proximate the embedding heads. Typically, the chip or chip module is placed on the substrate or in a recess formed in the substrate prior to any wire being embedded into the substrate. However, in the present invention, the chip/chip module may be placed in position after or during the wire embedding process.

The present invention provides an alternative approach of embedding wire into a substrate as described in the previously identified prior art patents and other known prior art. Rather than embedding the wire on one side of the terminal area of the RFID chip or chip module, guiding the wire directly over the terminal area, then embedding the insulated wire into the substrate on the opposite side of the terminal area, forming the antenna and then positioning the insulated wire directly over a second terminal area of the RFID chip and embedding it again, it is proposed that the embedding and bonding process begin with the wire adjacent to and laterally offset from the terminal area of a chip or chip module and that the wire not be passed over the terminal area. Rather, the wire is embedded into the substrate to form an antenna with the two end portions of the wire forming the antenna, not embedded in the substrate. The two end portions are positioned adjacent to and laterally offset from terminal areas of a chip or chip module. In one embodiment the full length of each of these end portions of wire are unsecured to the substrate. In a second step, after the antenna is formed, the end portions of the wire are moved into a position over or in contact with the terminal areas of the chip or chip module. The wire ends are not brought into contact with the terminal areas until after the antenna is fully formed, and bonding does not occur until the antenna is fully formed.

In a second embodiment of the invention, a first length of the wire is embedded in the substrate with the beginning portion of the first length of wire extending out of the substrate. This first length of wire is positioned adjacent to and laterally offset from a terminal area of a chip or chip module. A next continuous length of wire is not embedded in the substrate but is placed over the substrate. The next following length of wire is embedded into the substrate to form an antenna. Then, the next continuous length is positioned along the substrate but not embedded. Finally, a length of wire is embedded in the substrate with the final portion of that length of wire extending out of the substrate. The last two lengths of wire are positioned adjacent to and laterally offset from the terminal areas of a chip or chip module. The lengths of wire that are laterally offset from the terminal areas are then repositioned so that portions of those lengths of wire are positioned over or in contact with the terminal areas of the chip or chip module. These lengths of wire are not brought into contact with the terminal areas until after the antenna is fully formed.

In yet a further processing step in accordance with the method and apparatus of the present invention, a bonding element is provided that electrically connects the lengths of wire positioned over or in contact with the terminal areas to the designated terminal areas. Bonding does not occur until the antenna is fully formed.

It should be appreciated that these processing steps may all occur at a single location or may occur at multiple locations. For example, a single head element may include the ultrasonic embedding tools, the tool to reposition the lengths of wire over or in contact with the terminal areas, and the bonding tool. Alternatively, these tools may be positioned on two or more separate heads or each positioned on a separate tool head. Still further, the substrate may be moved to different positions for some or all of these process steps while the tools remain stationary.

Various other features and advantages will become apparent from a review of the following detailed description taken in conjunction with the drawings.

It should be appreciated that even though a chip module may be shown in the figures or described in the specification or claims, it is intended that a chip may be substituted for a chip module (or vice versa) without departing from the scope of the present invention.

DETAILED DESCRIPTION

Figure 1:
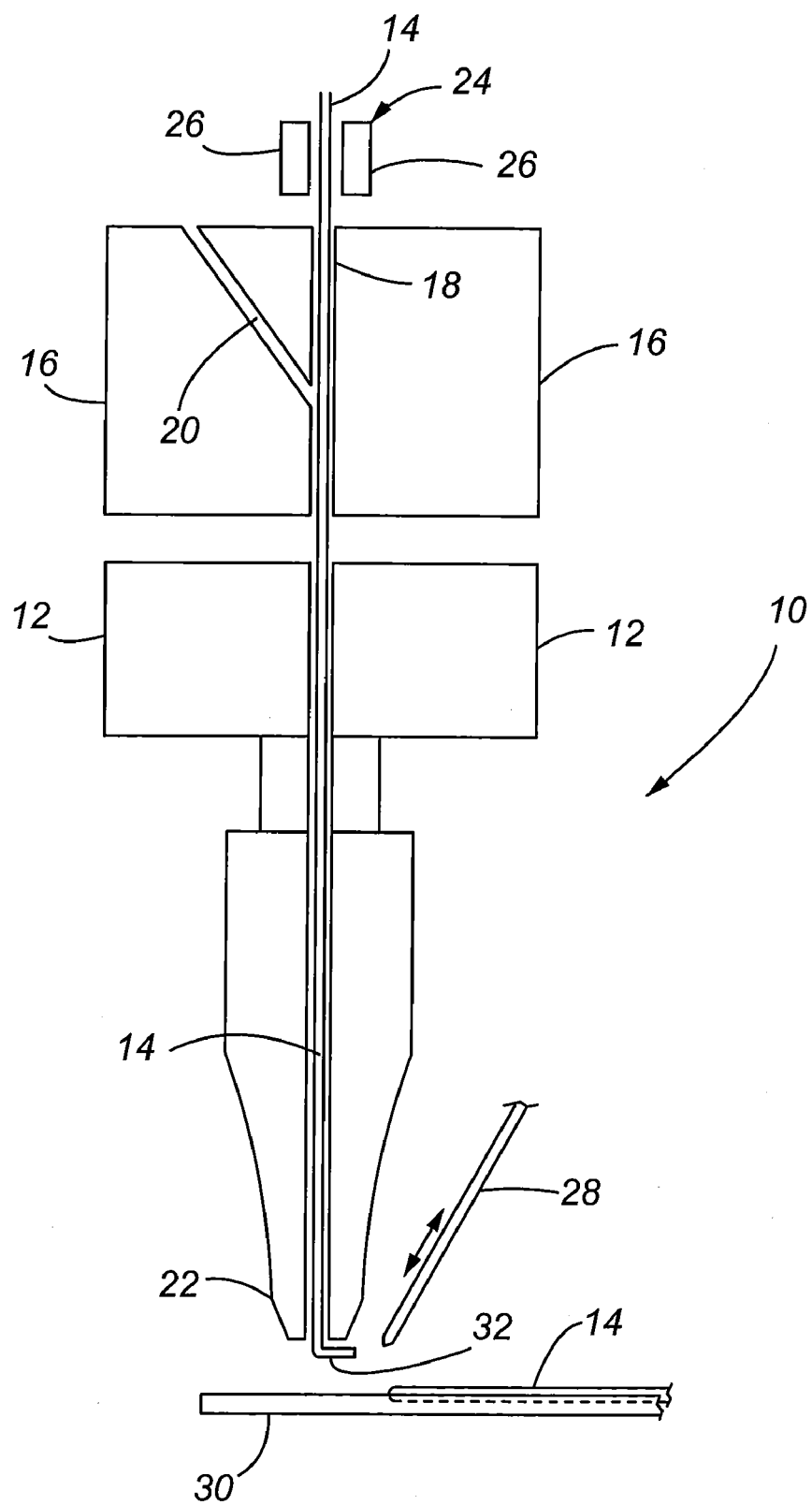
FIG. 1 is a schematic view of an embedding tool such as a sonotrode having a length of residual wire extending from the end of the capillary tube having been previously cut following completion of wire placement in an RF device.

FIG. 1 illustrates an example of an embedding device 10 such as an ultrasonic sonotrode. The sonotrode includes an ultrasonic transducer 12 that locally heats a wire 14 through ultrasonic vibration. The embedding tool further includes a manifold 16 which houses a capillary tube 18 and a compressed air channel 20 that communicates with the capillary tube 18. The wire 14 is routed through the capillary tube 18 so that it can be dispensed from the distal tip 22 of the sonotrode. A wire clamping mechanism 24 comprises one method to control the feed of wire. The clamping mechanism jaws 26 close together to prevent feed of the wire. The compressed air may control the rate at which the wire is dispensed from the capillary tube when the jaws are open.

As also shown in FIG. 1, a knife 28 may form a part of the overall apparatus 10 and reciprocate between an upper and lower position to cut the wire 18 as needed, such as at the completion of a wire embedding step. As shown, a length of wire is embedded partially in the substrate 30 and a residual amount of wire 32 extends from the distal tip 22 of the embedding tool 10 following the cutting operation. This residual amount 32 is typically equal to the distance between the distal tip of the embedding tool and the knife or cutting tool 28. If the knife 28 is positioned relative to the embedding tool 10, the residual length may vary.

Figure 2:
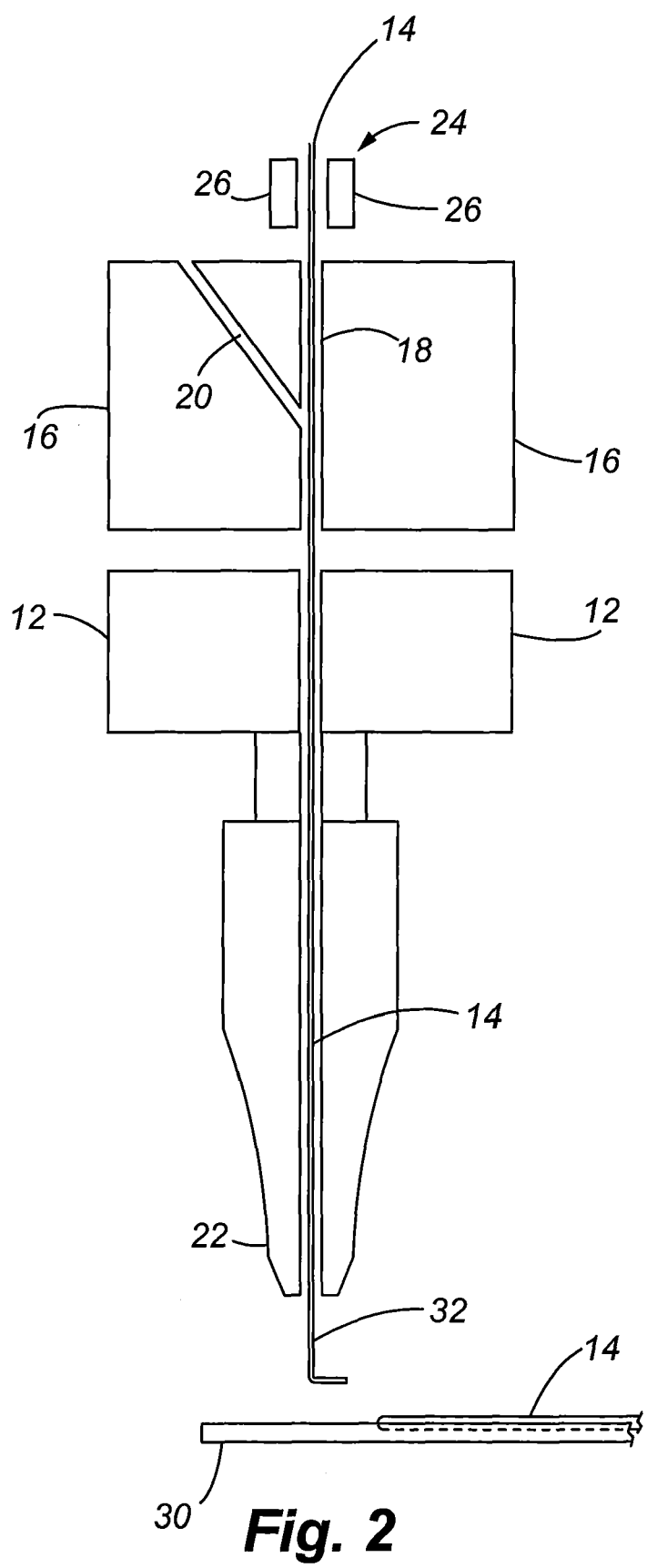
FIG. 2 is a schematic view of the embedding tool in a raised position wherein an additional length of wire is dispensed from the tool compared to that of FIG. 2.

Referring to FIG. 2, the embedding tool 10 is shown in a raised position relative to the substrate 30. A greater length of residual wire 32 is shown compared to that shown in FIG. 1. In addition to being able to change the position of the knife relative to the embedding tool, another way to achieve the additional length in the residual wire is by forcing air through channel 20 to push a length of wire out of the sonotrode. Alternatively, it is possible to lengthen the residual length of wire by moving the embedding tool away from a location where the wire is embedded in or otherwise fixed to the substrate. If the wire is fixed to the substrate and the clamping mechanism 24 is open, an additional length of wire will be drawn from the wire supply as the embedding head is moved. In any case, the residual length 32 of the wire 14 will be increased.

Figure 3:
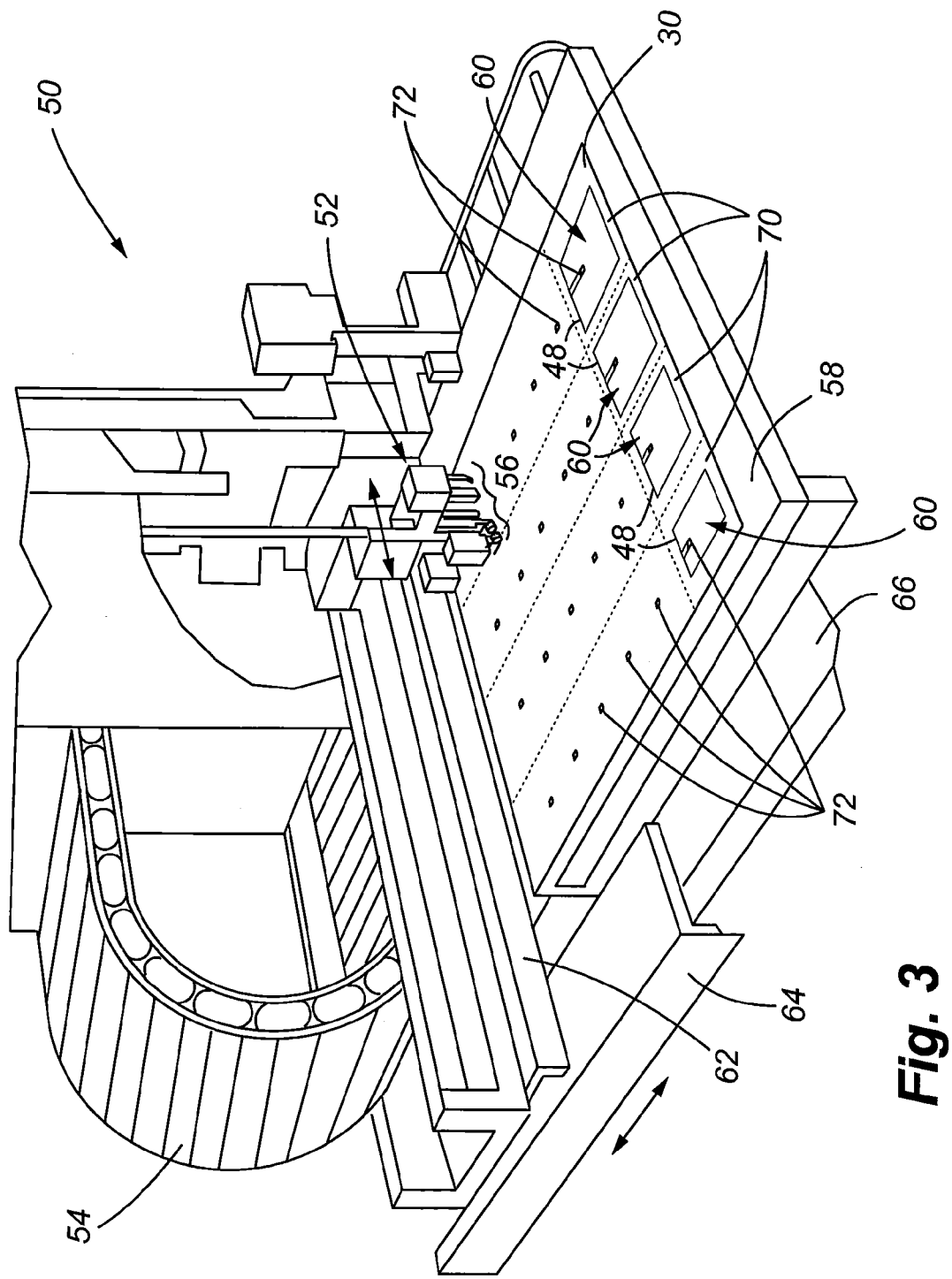
FIG. 3 is a fragmentary perspective view of a processing machine used to manufacture RF and/or RFID inlays.

FIG. 3 illustrates one embodiment of a processing apparatus or machine 50 for manufacturing RF and/or RFID inlays. The machine 50 may be generally described as including a power drive group 52, a flexible communications bus 54 that transfers operational instructions from a computer processor (not shown) and power to the working components of the machine. For example, the bus 54 may facilitate the transfer of electronic signals between the processor and the working elements 56 of the machine that creates the inlays. As discussed further below, the working elements 56 may include a group or combination of one or more embedding tools, wire transfer tools, wire cutting tools and thermal bonding heads. Alternatively, the individual tools may be independently positionable relative to the substrate. The working elements 56 traverse laterally across a support table 58 that secures a substrate 30 affixing the wire to the substrate and, in some embodiments, moving the wire to a position over or in contact with terminal areas, and perhaps bonding the wire to the terminal areas. In the example machine shown in FIG. 3, a lateral slide rail 62 allows the working elements 56 to traverse in the lateral direction across the substrate 30. A longitudinal frame 64 secured to the lateral side rail 62 allows the machine to traverse or index in the longitudinal direction along longitudinal side rails 66. The dashed or phantom lines 68 designate or outline the prospective zones 70 where individual inlays are formed on the common substrate 30. Reference number 72 is a chip or chip module previously placed on the substrate, or designates a recess where a chip or chip module may be placed in the future. As mentioned, each inlay 60 has at least one transponder comprising an integrated circuit chip or chip module 72 and a wire antenna 48 that is connected to the chip or chip module 72. A CNC or similar controller controls the positioning and movement of the working elements 56 relative to the substrate 30.

Figure 4:
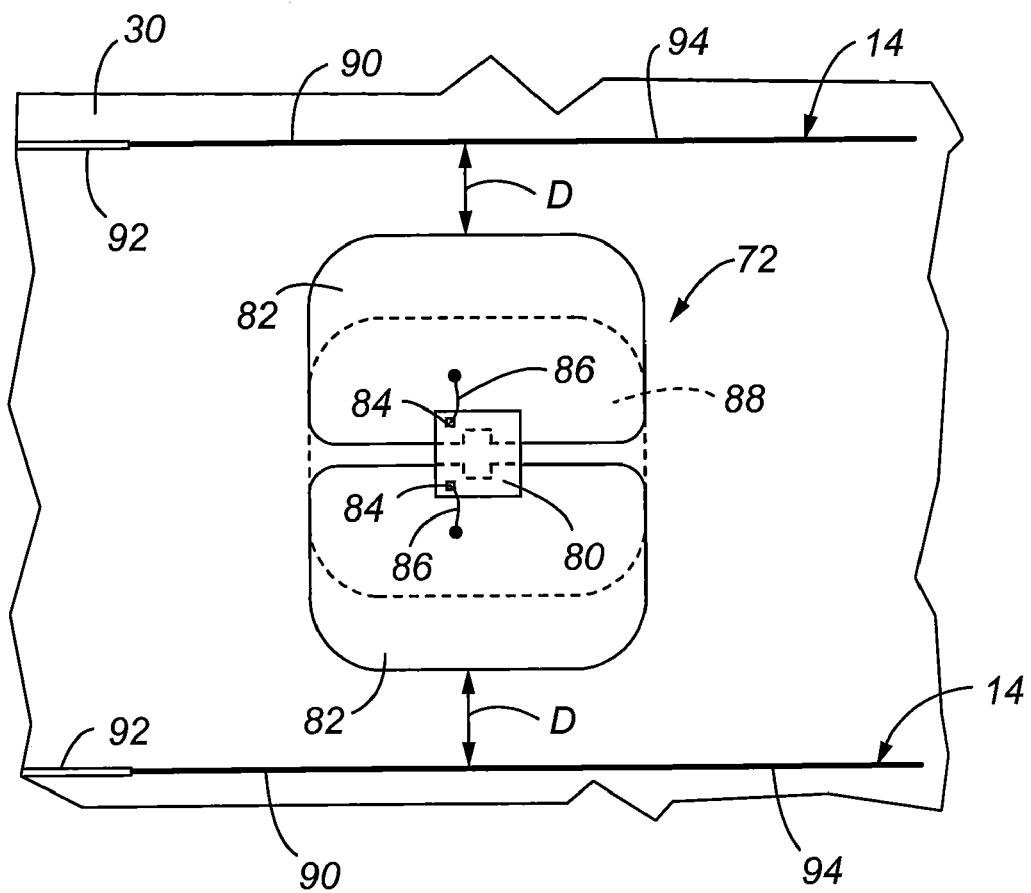
FIG. 4 is an enlarged plan view of a portion of an RF or RFID inlay specifically illustrating a chip module positioned on a substrate, and placement of opposing ends of the antenna coil adjacent the chip module.

Referring to FIG. 4, a portion of an RF or RFID inlay device (hereinafter "device") is illustrated. In accordance with the present invention, the device includes the substrate 30, typically made of a thermoplastic material or other material receptive to wire embedding (or may comprise a layer of material receptive to wire bonding, such as an adhesive layer, affixed to the surface of another layer of material substrate, a chip module 72, and an antenna element (not fully shown) formed by a continuous length of wire 14. The chip module 72 in a known construction includes an integrated circuit 80 and at least one pair of terminal pads or terminal areas 82. Contacts or terminal areas 84 formed on the integrated circuit 72 are electrically connected to the terminal areas 82 by means of one or more very small leads or conductors 86. A protective layer of material such as epoxy 88 (shown in phantom lines to differentiate it from the other elements) covers the integrated circuit 80, portions of the respective terminal areas 82, the interconnecting conductors 86 and contacts 84. Alternatively, the chip module may be constructed and assembled in other ways known to those of skill in the art or the integrated circuit 80, alone, may be used in place of a chip module 72, in which case the antenna wire 14 is directly bonded to the contacts or bonding pads 86.

The portions of the wire 14 shown in FIG. 4 labeled by reference number 90 are the opposing ends of the wire that form the antenna. For illustrative purposes, the portion of the wire 14 represented by a hollow line segment 92 depicts an embedded portion of the wire, while the solid line segment 94 represents a non-embedded portion. As shown, there also is a distinct lateral offset or gap, represented by distance D, between the end portion 90 of the wire 14 and terminal area 82 illustrating that the wire is not guided or positioned over or in contact with the terminal area 82 as it is positioned on or affixed to the substrate 30. In the preferred embodiment, only after the wire 14 is completely affixed to the substrate to form an antenna are the end portions 90 displaced for purposes of bonding a portion of the wires to the terminal areas 82 or 84.

Figure 5:
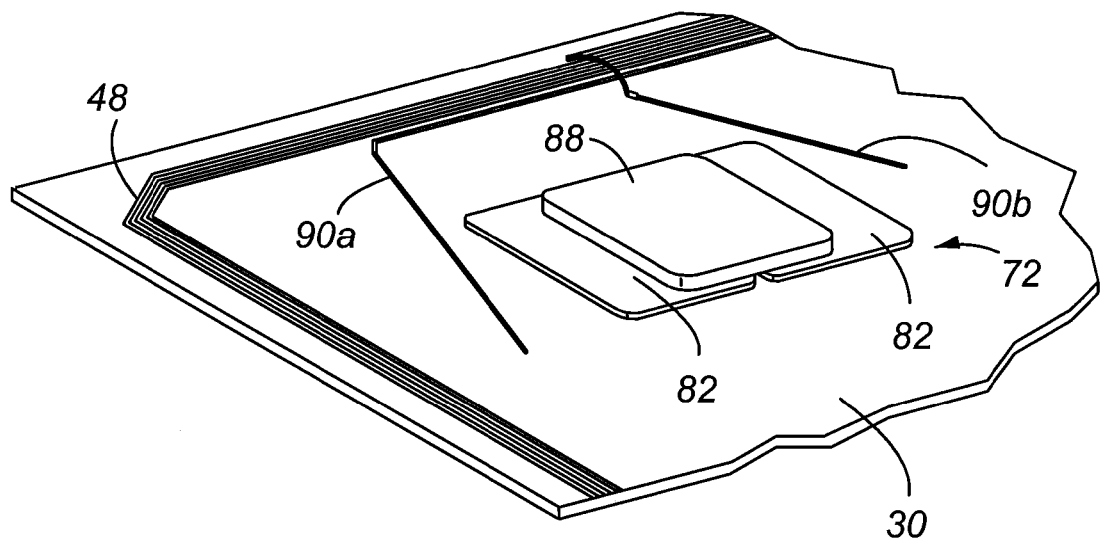
FIG. 5 is a partial perspective view of a portion of an RF or RFID inlay wherein the opposing ends of the antenna coil placed adjacent the chip module are formed as angular extensions from the coil and offset or spaced from the terminal areas.

Referring now to FIG. 5, a partially completed inlay is shown. The ends of the wire 90 are arranged as extensions from the embedded coil and they do not contact any part of the chip module 72. Rather, the ends or extensions 90 are positioned on the substrate 30 laterally offset from the chip module. Whether all, some portion or none of the ends 90 physically touch the substrate is unimportant. It should be appreciated that the technique used to position the initial length of wire 90*a* shown on the substrate 30, prior to formation of the antenna may differ from the technique used to position the end or second length of wire 90*b*. In forming the initial length 90*a*, no portion of the wire 14 is affixed to the substrate. Therefore, the act of moving the embedding head 10, alone, will not cause wire to be drawn or expelled from the tool 10. Accordingly, use of the compressed air supply, or other means known to those of skill in the art, would be needed to expel the desired length of wire from the embedding head. This is accomplished by forcing compressed air, or another appropriate gas, through channel 20 while the clamp mechanism 24 is open. Positioning the desired length of wire on the substrate may be accomplished by movement of the embedding head. Alternatively, because the embedding head is repeatedly used to form successive inlays, it is also possible to draw a desired length of wire from the embedding head sufficient to form initial length 90*a* prior to cutting the wire following formation of end portion 90*b* of the previously formed inlay. Once the initial length of wire 90*a* has been arranged on the substrate, the antenna 48 is formed by embedding the wire in the substrate. Following formation of the antenna, another length of the wire 90*b* is positioned generally as shown to form the second angular extension. The end 90*b* may be formed by forcing wire out of the embedding head using compressed air or, because the antenna has been formed and the wire is embedded in the substrate, the second end 90*b* may be formed by moving the embedding head to draw wire out of the embedding head. Because the wire is fixed to the substrate, additional length of wire will be drawn out of the embedding head as it moves.

Figure 6:
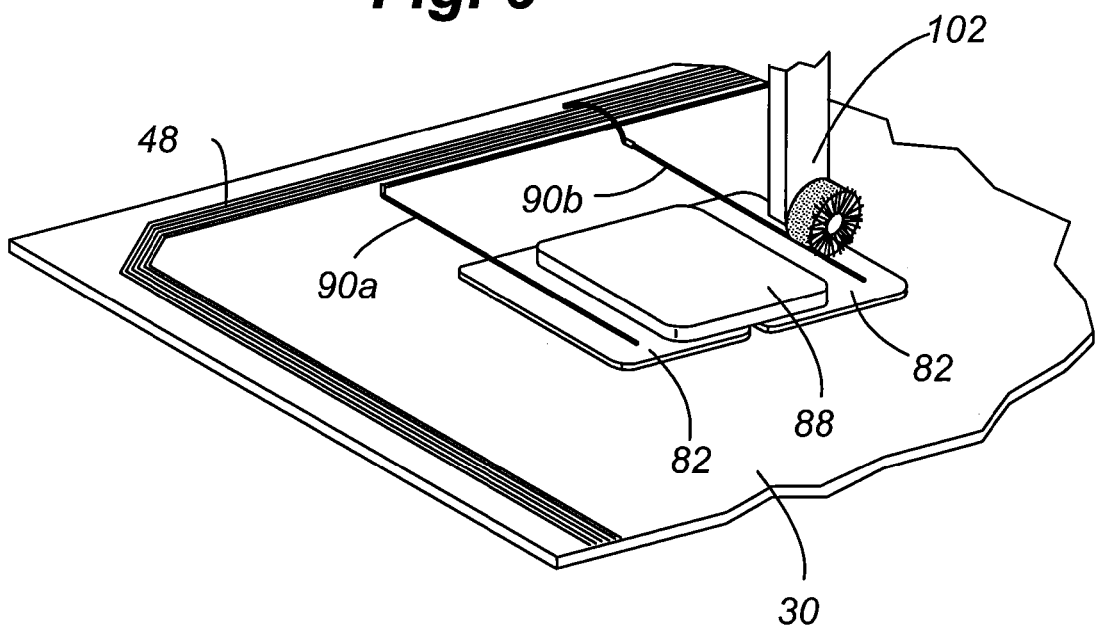
FIG. 6 illustrates the embodiment of FIG. 5 with the angular extensions positioned over the terminal areas by brushing or combing them over the terminal areas so that the extensions may then be thermally bonded to the terminal areas.

In the next step of the manufacturing process, an example of which is shown in FIG. 6, the extensions 90 are moved into position over or in contact with the terminal areas 82 for interconnection with the terminal areas 82. The extensions 90 may be mechanically moved into position, such as by a brush or comb or other mechanical instrument 102. One variety of brush is illustrated in FIG. 6. The mechanical positioner 102 may be another element incorporated in the group of working elements 56 on a single tool head, or it may be independently positionable. Alternatively, the extensions 90 may be manually gripped and moved into position. Again, the embedding tool does not traverse over any portion of the chip or chip module when positioning wire on the substrate. In the embodiment shown, the wire is cut at a position so that the extensions 90 are approximately the same length, and have approximately the same orientation with respect to the opposite sides of the terminal areas. However, it should be appreciated that the extensions 90 may have different lengths and/or orientations provided the relocation equipment can position the lengths of wire in contact with the terminal areas.

Figure 10:
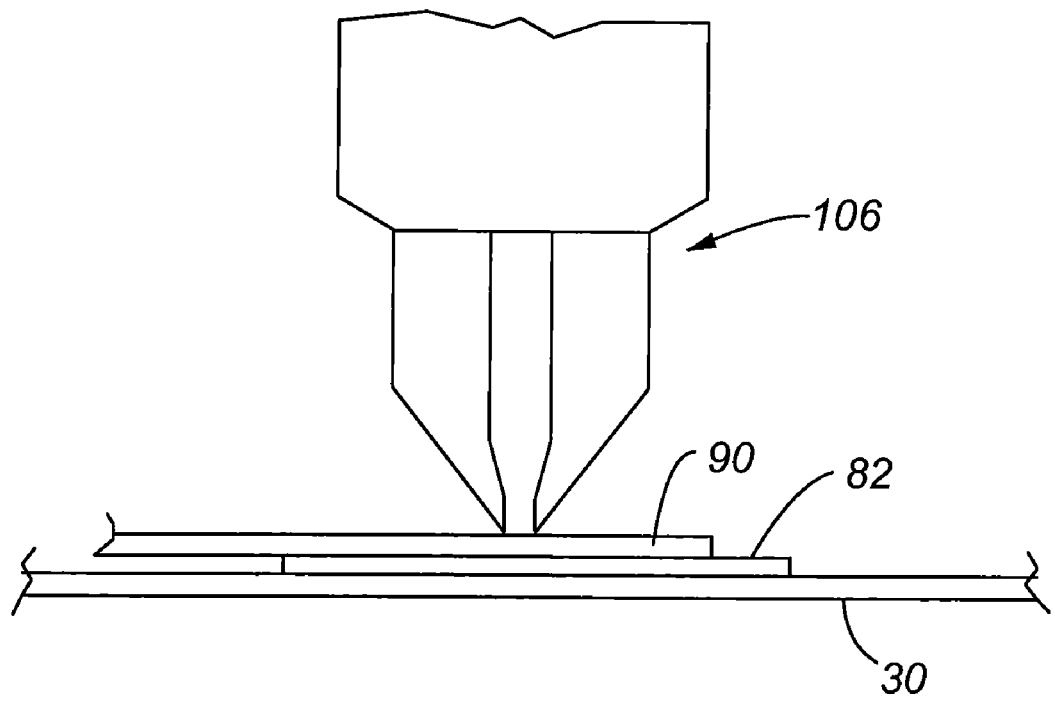
FIG. 10 is a fragmentary elevation view of a thermal compression bonding element positioned over the end of a wire, which is positioned on a terminal area.

Once the extensions are placed over the terminal areas, portions of the wire ends may be bonded to the terminal areas 82 using a thermal compression bonding element 106, as shown in FIG. 10. The bonding head 106 generates a voltage sufficient to electrically bond the wire to the terminal areas. The bonding head 106 is indexed or shifted from one bonding site to the next in order to sequentially bond each wire 90*a* and 90*b* to its corresponding terminal area.

Figure 7:
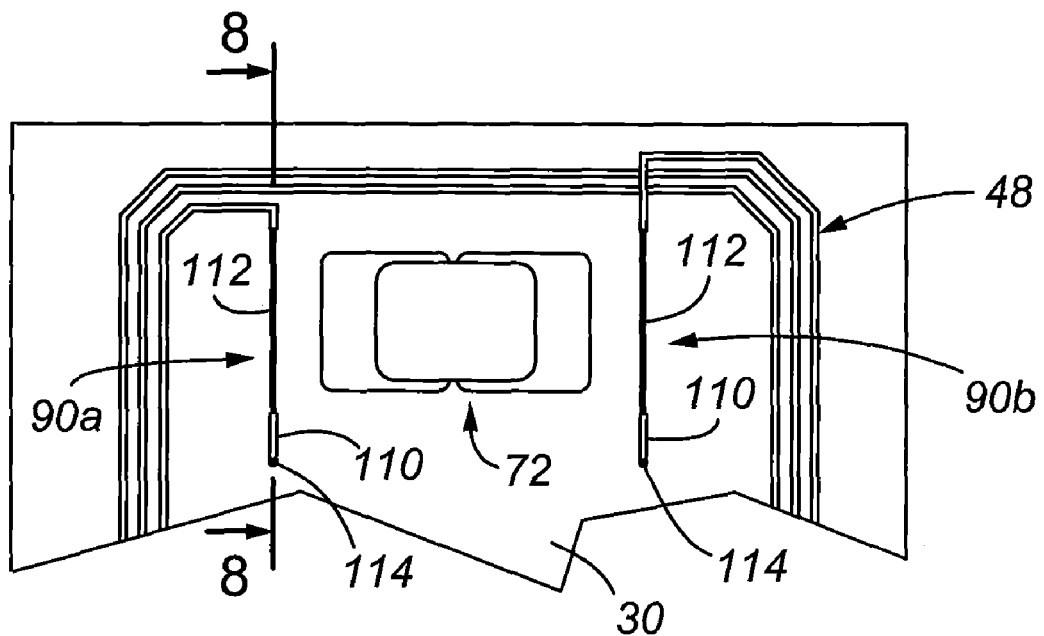
FIG. 7 is a top plan view of a portion of a second embodiment of an RF or RFID inlay where portions of the opposing ends of the antenna wire are embedded in the substrate.
Figure 8:
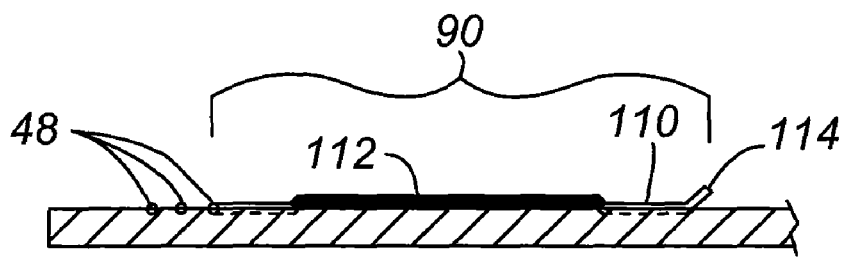
FIG. 8 is a cross-sectional view taken along line 8-8 of FIG. 7.
Figure 9:
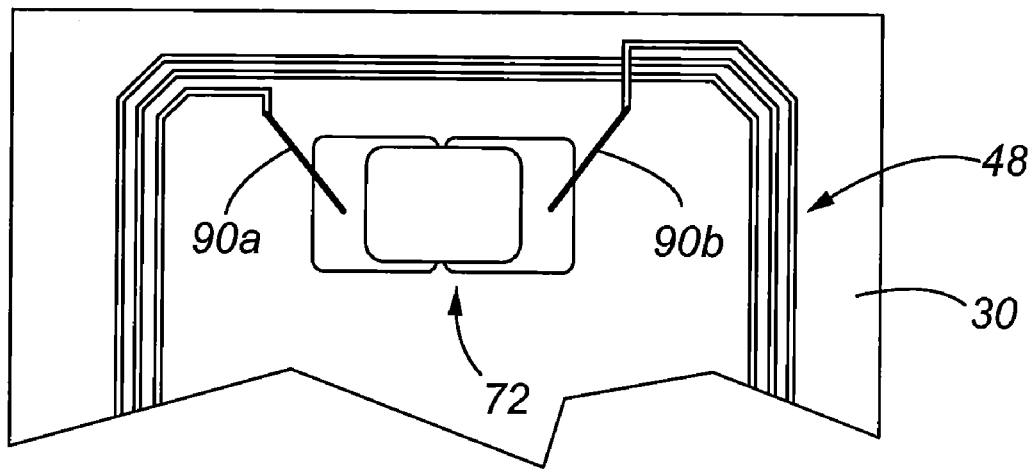
FIG. 9 is a top plan view of a portion of an RF or RFID inlay specifically illustrating a chip module positioned on a substrate, and the opposing ends of the antenna coil repositioned in contact with terminal areas of the chip module.

With reference to FIGS. 7 and 8, in an alternative method, an initial portion 110 of the wire ends 90*a* is affixed to or embedded in the substrate for a relatively short distance, approximately 0.5 to 1.0 centimeters, although this length may vary. The ultrasonic transducer is then preferably turned off and the embedding head is moved relative to the substrate a distance from the first embedding location, thereby forming a non-unembedded portion 112. The ultrasonic transducer is turned on, and a further length of wire is embedded in the substrate, to form an antenna 48, for example. As a result of the actions of turning off the ultrasonic transducer and the continued movement of the embedding head, a portion of the wire 112 is not fixed to or embedded in the substrate. This length of wire is formed at a position laterally offset from the terminal areas of the chip or the chip module. The term laterally offset as used herein is defined generally relative to the plane of the substrate. Following completion of formation of the antenna 48 in the substrate, a second length of wire 90*b* is similarly formed and positioned at a second location on the substrate laterally offset from a second terminal of the chip or chip module. A portion 112 of the second length of wire 90*b* is not embedded into or affixed to the substrate. A final length of wire 110 is then embedded into the substrate. As shown, a tail portion 114, likely comprising the residual length of wire 32 illustrated in FIG. 1, is not embedded in the substrate, but extends out of the substrate. As with the first embodiment, the end portions 90*a* and 90*b* are formed at positions offset or spaced from the terminal areas and chip, and therefore no portion of the end portions 90 are positioned over or in contact with any portion of the chip 80 or terminal areas 82.

There are advantages of embedding a relatively small portion 110 of the ends 90. As a first matter, it positively locates or stabilizes the ends 90*a* and 90*b* in a known location. This facilitates subsequent movement of the ends 90*a* and 90*b* to a position over or in contact with the terminal areas 82 or 84, whether the movement is effectuated manually or mechanically. Also, it eliminates or reduces the need to use compressed air to force the wire out of the embedding tool when the first end portion 90*a* is formed. By embedding or anchoring a small portion 110 of the wire 14, the subsequent length of wire 112 may be pulled from the wire supply by movement of the embedding head. A s further alternative, applicable to both embodiments, an adhesive may be applied to the substrate at positions laterally offset from the terminal areas of the ship or ship module to temporarily hold and align the ends 90*a* and 90*b* at a desired location.

In a subsequent processing step of the type described in association with the first embodiment, the apparatus includes a wire-displacing tool that is used to reposition the lengths of wire 90*a* and 90*b* over or in contact with the terminal areas of the chip or chip module such that they may then be bonded to the designated terminal areas. Mechanical means may be provided to position the ends of wire 90*a* and 90*b* in contact with the terminal areas, such as by use of a brush or comb device as illustrated in FIG. 6. It is contemplated that the lengths of wire 110 that are embedded in the substrate are sufficiently short in length or the action of the mechanical element sufficiently robust that the action of the mechanical wire moving element can pull or remove the embedded lengths of wire 110 from the substrate 30 in order to reposition the wire as appropriate. If the ends are to be manually moved, either or both of the non-embedded portions 112 and 114 may be grasped by an individual, removed from the embedded state and moved into position.

While the foregoing invention has been disclosed with respect to preferred embodiments, it shall be understood that various other changes and modifications can be made to the invention in accordance with the scope of the claims appended hereto.

What is claimed is:

1. A method of manufacturing a radio frequency device, said method comprising:
   providing a substrate defining a substrate plane, and an integrated circuit positioned on said substrate or in a recess formed on said substrate, and a pair of terminal areas associated with said integrated circuit;
   affixing a wire to said substrate, said affixing step including:
   (i) positioning a first portion of said wire on said substrate laterally offset and spaced from one of said terminal areas;
   (ii) affixing a second portion of the wire to the substrate to form the windings of an antenna;
   (iii) positioning a third portion of said wire on said substrate laterally offset and spaced from the other of said terminal areas; and,
   in a subsequent step, repositioning the first portion of said wire to a position over or in contact with a first terminal area of the integrated circuit; and,
   repositioning the third portion of said wire to a position over or in contact with the second terminal area of the integrated circuit.

2. The method, as claimed in claim 1, wherein:
   said positioning steps include placing said wires on said substrates but not embedded in said substrate.

3. The method, as claimed in claim 1, wherein:
   said first and third portions are repositioned by a mechanical device.

4. The method, as claimed in claim 3, wherein:
   said first portion and said third portion are moved by a brush or comb.

5. The method, as claimed in claim 1, wherein:
   said positioning step includes embedding wire in said substrate.

6. The method as claimed in claim 1, wherein said terminal areas comprise electrically conductive contact areas disposed on said integrated circuit or eclectically conductive contact areas associated with an integrated circuit module.

7. A method of manufacturing a radio frequency device, said method comprising the steps of:
   providing a substrate, said substrate defining a substrate plane;
   providing an integrated circuit and at least two terminal areas associated with the integrated circuit;
   positioning said integrated circuit and at least two associated terminal areas on said substrate or in a recess associated with said substrate;
   embedding portions of a continuous length of wire in said substrate to form an antenna and to form first and second end portions of said antenna to connect to said at least two terminal areas, said embedding step including:
   (i) at a position laterally offset from said terminal areas embedding a first portion of said first end portion in said substrate and positioning a second portion of said first end portion over said substrate and not embedding the second portion in said substrate;
   (ii) following said second portion, embedding a length of wire in said substrate to form an antenna;
   (iii) at a position laterally offset from said terminal areas forming a second end portion of said wire, said second end portion comprising a first portion following said antenna portion, said first portion not embedded in said substrate, and a second portion following said first portion and said second portion is embedded in said substrate;
   displacing the first and second end portions of wire such that at least some of said first and second end portions of wire are positioned over at least some portion of corresponding terminal areas; and
   electrically connecting said at least some of said first and second end portions of wire to the corresponding terminal areas.

8. The method, as claimed in claim 7, wherein displacing said first and second end portions is performed by a mechanical device.

9. The method, as claimed in claim 7, wherein:
   said displacing steps removes wire from said substrate that had been previously embedded in said substrate.

10. The method, as claimed in claim 9, wherein said first portion of said first end portion and said second portion of said second end portion are removed from an embedded state as a result of displacing said first and second end portions.

* * * * *